United States Patent [19]
Hashoian et al.

[11] Patent Number: 5,243,287
[45] Date of Patent: Sep. 7, 1993

[54] DYNAMICALLY DETUNED NMR FIELD COIL

[75] Inventors: Ralph S. Hashoian, Brookfield; Robert W. Prost, Nashotah; Perry S. Frederick, Waukesha, all of Wis.

[73] Assignee: General Electric Company, Milwaukee, Wis.

[21] Appl. No.: 874,656

[22] Filed: Apr. 27, 1992

[51] Int. Cl.⁵ .............................................. G01V 3/00
[52] U.S. Cl. .................................. 324/318; 324/322; 128/653.5
[58] Field of Search ............... 324/322, 318, 313, 314, 324/307; 128/653.5

[56] References Cited

U.S. PATENT DOCUMENTS

| | | | |
|---|---|---|---|
| 4,620,155 | 10/1986 | Edelstein et al. | 324/322 |
| 4,680,548 | 7/1987 | Edelstein et al. | 324/318 |
| 4,820,987 | 4/1989 | Mens | 324/322 |
| 4,833,409 | 5/1989 | Eash | 324/318 |
| 4,890,063 | 12/1989 | Haragashira | 324/322 |
| 5,144,244 | 9/1992 | Kess | 324/322 |

Primary Examiner—Louis Arana
Attorney, Agent, or Firm—Quarles & Brady

[57] ABSTRACT

A high-pass bird cage coil serves as the whole-body RF coil in an NMR system. This coil is detuned when other RF coils are used to transmit or receive during a pulse sequence. This detuning is accomplished by detuning circuits that contain pin diodes which shunt the tuning capacitors in the bird cage coil.

9 Claims, 3 Drawing Sheets

FIG. 3
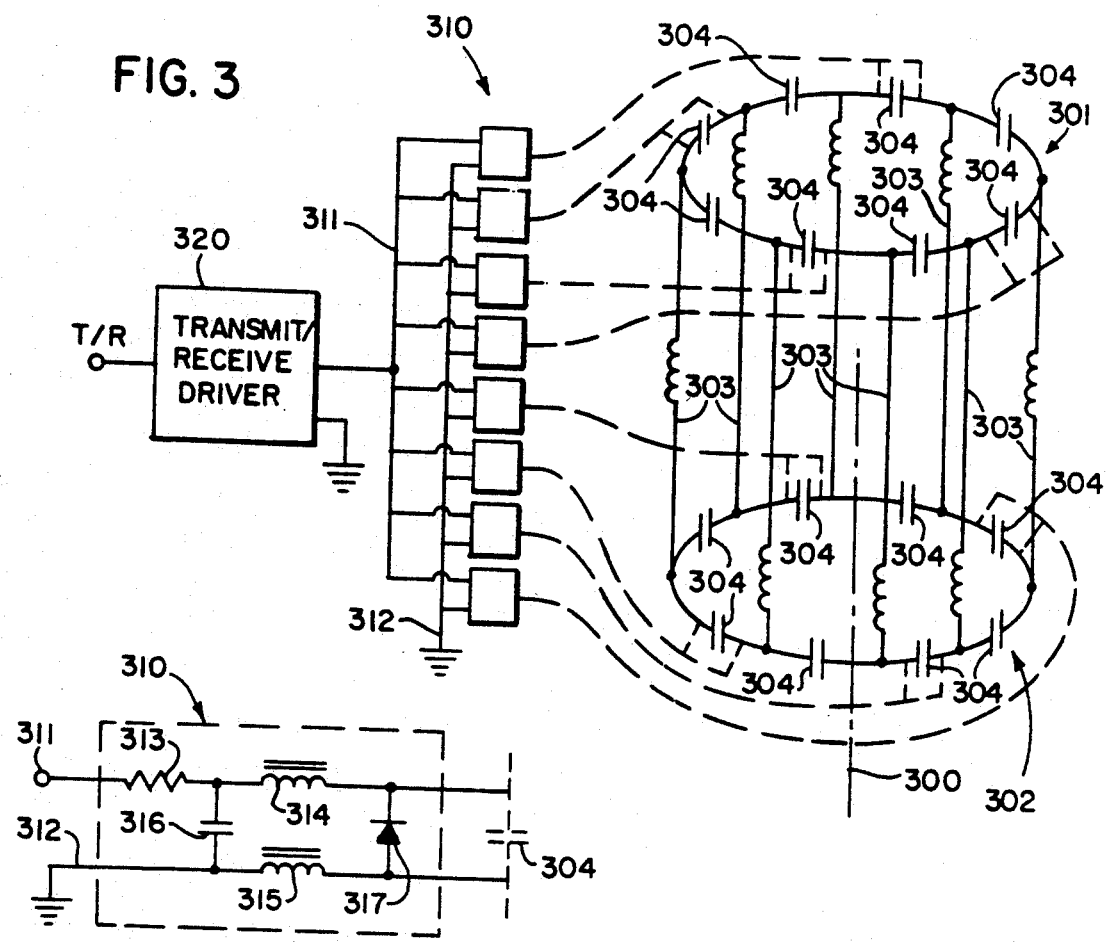
FIG. 4
FIG. 5
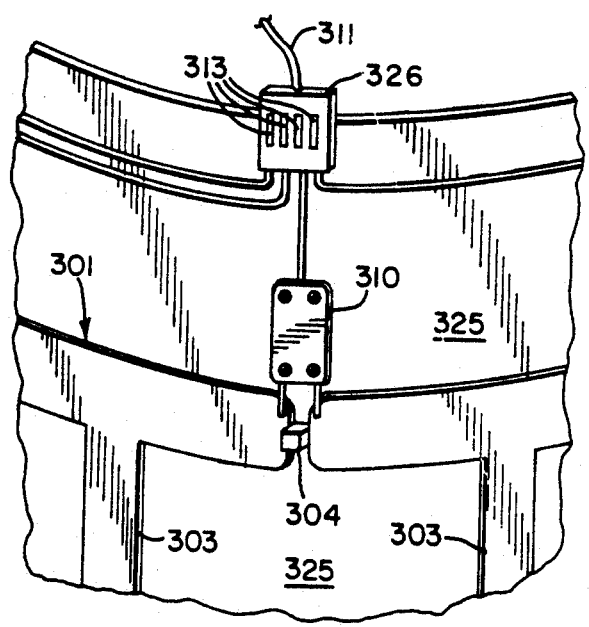

DYNAMICALLY DETUNED NMR FIELD COIL

BACKGROUND OF THE INVENTION

The field of the invention is nuclear magnetic resonance imaging methods and systems. More particularly, the invention relates to an improved RF volume coil which can be decoupled from other coils in the system during an NMR pulse sequence.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant Y of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

In an NMR imaging system the excitation field is in the radio frequencies and is produced by an RF coil. The NMR signal which results is also in the radio frequencies and may be sensed by the same RF coil or a separate RF coil. For example, it is common practice to employ an RF volume coil which produces a uniform RF excitation field throughout a large volume and to employ a separate RF surface coil to receive the resulting NMR signal from a well defined region within the large volume.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

The magnetic field gradients used for imaging are short in duration (milliseconds) and high in field strength. During a single NMR measurement pulse sequence for example, the gradient for each axis ($G_x$, $G_y$, $G_z$) may be pulsed one or more times and reversed in polarity. The resulting magnetic fields produce forces on the electrically conductive elements of the system, including the RF coil. These forces cause movement or vibration of these elements and such movement of the RF coil elements can induce noise into the acquired NMR data. The physical construction of the RF coil is, therefore, an important design consideration.

As noted above, the RF excitation and the resulting NMR signal are both at the Larmor frequency. As a consequence, both the RF excitation coil and the NMR receive coil must be tuned to resonate at this frequency. The cross coupling of two coils tuned to the same frequency and located within the same region of interest presents a problem. This cross coupling causes nonuniformity in the RF excitation field, frequency shifts and impedance shifts in both coils, and the acquisition of a degraded NMR signal.

The solution to the cross coupling problem is to detune the receive coil while the RF excitation field is being produced and to detune the RF excitation coil when the NMR signal is being acquired. Mechanical switches are not fast enough to use during the NMR pulse sequence and electronic switches must be used. For example, the use of diodes as switches to selectively detune a pair of co-planar surface coils is described in U.S. Pat. No. 4,620,155. Similarly, a set of diodes are employed as switches in U.S. Pat. No. 4,833,409 to detune a whole body coil by shorting its end rings to a surrounding shield. While the latter solution effectively detunes the whole body coil during acquisition of the NMR signal, its performance is less than ideal. First, the increased RF losses in this circuit and connections to the shield, as well as the leakage impedance of the diodes degrades the quality factor of the coil and reduces image quality. And second, the physical connections between the RF coil and the surrounding shield are costly to manufacture if they are to withstand the physical beating imposed by the forces caused by the high gradient field pulses used in modern NMR pulse sequences.

SUMMARY OF THE INVENTION

The present invention relates to an RF volume coil for an NMR system, and particularly, to a whole body coil of the type having two spaced end loops joined by a set of longitudinal elements and means for detuning such a coil without degrading its performance. More specifically, the present invention is an improved RF volume coil having a pair of spaced end loops joined by a set of longitudinal conductive elements, each end loop having a set of capacitive elements which function in combination with the inductance of the longitudinal conductive elements to tune the RF volume coil to the desired Larmor frequency, and electronic switch devices connected across a capacitive element in each of said end rings and being operable in response to a control signal to provide a low impedance path which shunts said capacitive elements and thereby detunes the RF volume coil.

A general object of the invention is to electronically detune an RF volume coil without impairing its operation as a tuned coil. By using passivated pin diodes as the electronic switch devices, the leakage currents are minimal and coil performance is not degraded during RF reception.

Another object of the invention is to provide a detunable, whole body RF volume coil which is physically stable during the application of high gradient field pulses and which is economical to manufacture. By eliminating connections between the RF coil and its surrounding shield the mechanical soundness can be significantly improved and the cost of manufacture can be reduced. The electronic switch devices are mounted to the same supporting substrate that supports the end loops and capacitive elements The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 3 is a schematic representation of the whole body, RF volume coil, which is used in the NMR system of FIG. 1;

FIG. 4 is a circuit diagram of the detuning circuit which is employed with the coil of FIG. 3; and FIG. 5 is a partial perspective view of the preferred embodiment of the whole-body coil of the present invention.

DETAILED DESCRIPTION OF THE INVENTION

Figure 1:
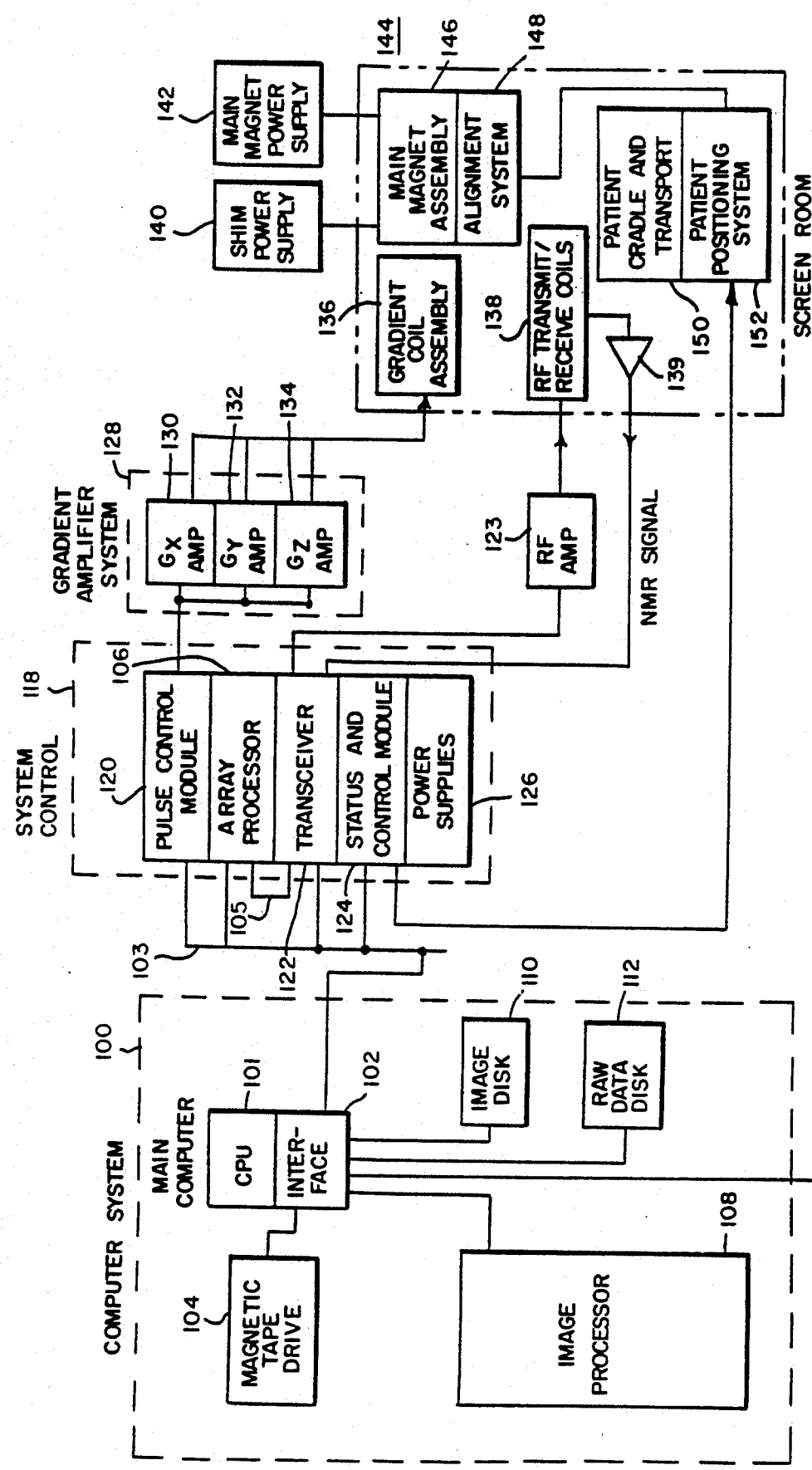
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112 An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize a shim coil associated with the main magnet and which are used to correct inhomogeneities in the polarizing magnet field. In the case of a superconductive magnet, the main power supply 142 is utilized to bring the polarizing field produced by the magnet to the proper operating strength and is then disconnected. The patient alignment system 148 operates in combination with a patient cradle and transport system 150 and patient positioning system 152 To minimize interference from external sources, these NMR system components are enclosed in an RF-shielded room generally designated 144.

Figure 2:
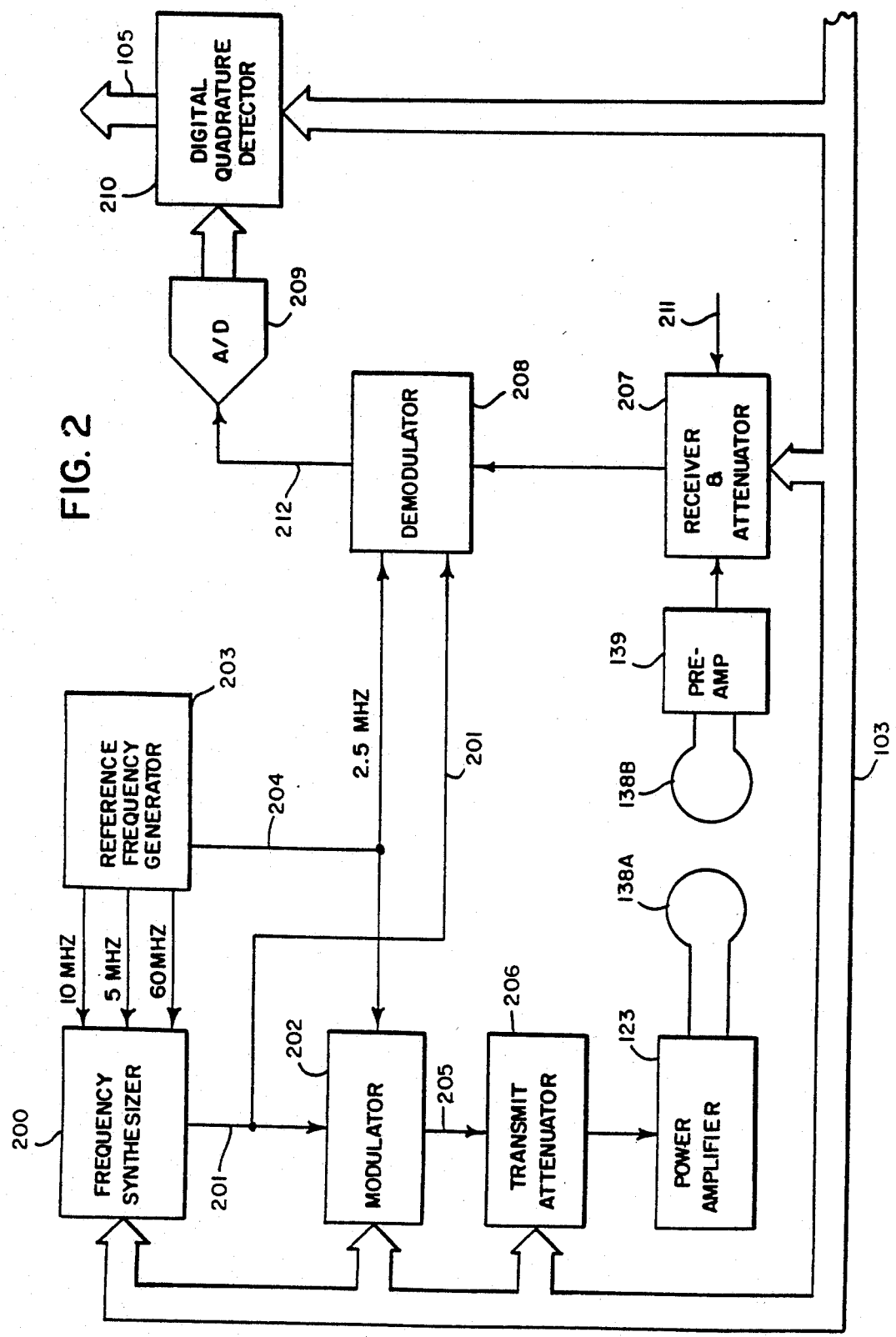
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF Carrier is applied to a modulator 202 where it is modulated in response to a signal R(t) received through the link 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103 The receiver 207 is also turned on and off by a signal through line 211 from the PCM 120 such that the NMR signal is acquired only over the time intervals required by the particular acquisition being performed.

The received NMR signal is at or around the Larmor frequency. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

The RF coils 138A and 138B may take many forms depending on the scan being performed. The NMR system includes a single, whole-body RF coil which may operate as both the transmit coil 138A and the receive coil 138B. In such case, a transmit/receive switch connects this coil to both the power amplifier 123 and the receiver 207. The transmit/receive switch is controlled by a T/R signal from the pulse control module 120 to electrically connect the single coil 138 to the power amplifier 123 during the generation of RF excitation pulses, or to connect it to the receiver 207 when the NMR signal is being acquired.

In a second mode of operation, the RF coils 138A and 138B may take the form of a single local coil, such as the head coil disclosed in U.S. Pat. No. 4,641,097. In such case the transmit/receive switch is disconnected from the whole body coil and reconnected to the local head coil. In this mode of operation the local head coil is employed during both the transmit and receive portions of the pulse sequence and the whole-body coil is detuned according to the teachings of the present invention so as not to disturb the RF fields through mutual inductance with the local head coil.

And finally, in a third mode of operation the whole-body coil is employed during the transmit portion of the pulse sequence to produce the RF excitation field throughout its relatively large volume of interest, and a local surface coil, such as that disclosed in U.S. Pat. No. 4,620,155 may be employed to acquire the NMR signal from a small region in the volume of interest. Such surface coils are designed, for example, to receive NMR signals from specific regions of the human anatomy better than the whole-body coil. In such case the power amplifier 123 connects to the whole-body coil and the local surface coil connects to the receiver 207. The T/R control signal is employed to detune the whole-body coil during the receive portion of the pulse sequence as will now be described in detail.

Referring particularly to FIG. 3, the whole-body coil is shown schematically as including a pair of conductive loop elements 301 and 302 which are disposed around a central axis 300 and which are connected together by a set of longitudinal conductive elements 303. The longitudinal conductive elements 303 are equally spaced around the circular conductive loops 301 and 302 and they are parallel to each other and the central axis 300. Capacitors 304 are connected in each loop element 301 and 302, with one capacitor disposed between each pair of connections to the axial conductive elements 303. The capacitors 304 have a value which operates in combination with the distributed inductance of the longitudinal conductive elements 303 to produce resonance at the Larmor frequency. This whole-body RF coil is described in detail in U.S. Pat. No. 4,680,548, which is incorporated herein by reference and which is referred to in the art as a "high-pass bird cage" coil.

In the preferred embodiment the whole-body coil is employed with a 0.5 Tesla polarizing magnetic field and is tuned for a 21.3 MHz Larmor frequency, although a similar coil has also been constructed for use with a 1.5 Tesla polarizing magnetic field and a Larmor frequency of 63.86 MHz. While FIG. 3 shows eight longitudinal conductive elements 303, sixteen equally spaced longitudinal conductive elements 303 are employed in the preferred embodiments. The important factor in this coil design is that the values of the capacitors 304 determine its resonant frequency and that a substantial change in those values will detune the coil away from the Larmor frequency. This detuning is the general object of the present invention.

Referring to FIGS. 3 and 4, the detuning of the whole-body coil is achieved by a set of eight detuning circuits 310 which connect directly across eight of the capacitors 304. Four of the detuning circuits 310 connect across alternate ones of the capacitors 304 in the conductive loop 301 and four of them connect across alternate ones of the capacitors 304 in the other conductive loop 302. While detuning circuits 310 Could be connected across all capacitors 304, good performance has been achieved with just eight by staggering their connections in the two conductive loops 301 and 302 as shown. This alternate and staggered connection of the detuning circuits 310 provides the best cost/performance solution.

The detuning circuit 310 is shown schematically in FIG. 4 and it includes a pair of inputs 311 and 312. The input 312 is connected to signal ground and the input 311 is connected to the inputs 311 on each of the other detuning circuits 310. The input 311 also connects through a current limiting resistor 313 to an RF choke 314, and the input 312 connects to a second RF choke 315. A filter capacitor 316 connects across the input side of the RF chokes 314 and 315 and a pin diode 317 connects across the output side of the RF chokes 314 and 315. The two terminals on the pin diode 317 form the outputs of the detuning circuit 310 which are connected across its coil capacitor 304. As a result, the pin diode 317 is connected in parallel, or shunt relationship, with its associated capacitor 304.

When a positive DC voltage is applied to the input 311, the pin diode 317 is reverse biased and it presents a very high impedance shunt path for the capacitor. In addition, the RF chokes 314 and 315 provide a very high impedance to the high frequency RF signals in the whole-body coil, and as a result, the detuning circuit 310 has negligible effect on the operation of the whole-body coil when driven with a positive DC voltage. On the other hand, when a negative DC voltage is applied to the input 311 of the detuning circuit 310, the pin diode 317 becomes forward biased and conducts current. In this forward biased condition, the pin diode 317 presents a very low impedance shunt path around its associated capacitor 304. This effectively short circuits the capacitor 304 and removes it from the whole-body coil. As a result, the whole-body coil is detuned and its effect on the operation of other coils is significantly reduced.

Except for the pin diode 317, the other components in the detuning circuits 310 are standard, commercially available products. The RF chokes 314 and 315 have an inductance of 3.3 $\mu$H and the capacitor 316 has a value of 0.01 $\mu$F. The resistor 313 is selected to limit the current flow through the forward biased pin diode 317 to approximately one ampere. This insures that the pin diode 317 is in its low impedance state when forward biased.

The pin diode 317 is very important to the successful operation of the present invention. When reverse biased it is important that it have a very high impedance to the RF signals in the whole-body coil and that its leakage current be minimal. It is one of the discoveries of the present invention that substantially improved results can be achieved if the surface of the pin diode is passivated to reduce its leakage current when reverse biased. This is in contrast to prior pin diodes which are encapsulated with a low firing glass to reduce their leakage currents. In addition, the pin diode 317 must have a sufficiently high break down voltage ($>$1,000 volts in the preferred embodiment) to withstand the high voltages produced in the whole-body coil during the transmit mode. Pin diodes preferred for this application are commercially available from M/A Com Semiconductor Division of Burlington, Mass. as the MA4P4000 series devices.

Referring again to FIG. 3, the inputs to the detuning circuits 310 are driven by a transmit/receive driver circuit 320. The driver circuit 320 connects to signal ground and to the inputs 311 on each detuning circuit 310. When the whole-body coil is to operate at its tuned Larmor frequency, the driver circuit 320 produces a 450 volt positive DC voltage on the input 311. Since this reverse biases all the pin diodes 317, very little current flows. On the other hand, when the whole-body coil is to be detuned, the driver circuit applies a negative DC voltage to the inputs 311. This forward biases the pin diodes 317 and substantial current flows through them. The driver circuit limits that current to eight amperes such that each detuning circuit conducts approximately one ampere as described above. The value of the resistor 313 in each detuning circuit 310 is significantly higher than the resistance of the forward biased pin diodes 317. This resistance dominates the input resistance seen by the driver circuit 320 and masks any small variations in the resistances of the forward biased pin diodes 317. The T/R control line from the pulse control module 120 is employed to switch the transmit/receive driver circuit 320 between its two states.

In contrast to prior detuning circuits which require elaborate and expensive mechanical supports for the circuit elements and the connections to the surrounding shield, the detuning circuit 310 of the present invention is simply mounted on the same substrate that supports the bird cage coil. Referring to FIG. 4, the bird cage coil elements are mounted on a tubular shaped substrate 325 which is made of fiberglass. The coil elements 301 and 303 are formed of copper foil and are bonded in place. The capacitors 304 are soldered directly to the copper foil and each detuning circuit 310 is mounted to the substrate immediately along side its associated capacitor 304. Leads from the detuning circuit 310 solder directly to the copper foil to provide the shunt path as described above. In the preferred embodiment, the current limiting resistors 313 are mounted separately on a board 326 so that the heat which they produce is physically removed from the other circuit elements.

In addition to providing physical support for each detuning circuit 310, windows (not shown in the drawings) are formed in the tubular substrate 325 to allow easy access to the circuit elements by maintenance personnel. The circuit elements face inward toward the central opening in the NMR system and are accessible therefrom by removing a small panel.

We claim:

1. An RF volume coil for an NMR system which comprises:
   a pair of spaced end loops, each positioned about a central axis;
   a set of longitudinal conductive elements connected to the pair of spaced end loops and extending therebetween along the direction of the central axis;
   a set of capacitors connected in each end loop and having values which tune the coil to resonate at the Larmor frequency of the NMR system;
   a set of detuning circuits, each detuning circuit having a pin diode which connects in shunt with a respective one of said capacitors; and
   a driver circuit which connects to each of said detuning circuits and is responsive to a control signal to either produce a voltage which reverse biases said pin diodes and thereby open circuits the shunt path they provide for their respective capacitors, or produce a current which forward biases said pin diodes and thereby short circuits the shunt path they provide for their respective capacitors to thereby detune the coil from said Larmor frequency.

2. The RF volume coil as recited in claim 1 in which said set of capacitors includes capacitors connected in each of said end loops at points between pairs of connections of said end loop to the longitudinal conductive elements, and said detuning circuits connect to alternate ones of said capacitors in each of said loops.

3. The RF volume coil as recited in claim 2 in which the alternate connections of the detuning circuits to the capacitors in one of said end loops is staggered from the alternate connections of the detuning circuits to the capacitors in the other end loop.

4. The RF volume coil as recited in claim 1 in which each of said pin diodes is passivated to reduce its leakage current when reverse biased by said driver circuit.

5. The RF volume coil as recited in claim 1 in which each detuning circuit includes an RF choke connected between its pin diode and the driver circuit.

6. The RF volume coil as recited in claim 5 in which each detuning circuit has a pair of inputs connecting it to the driver circuit, and a pair of RF chokes connect said pair of inputs to respective leads on the pin diode.

7. The RF volume coil as recited in claim 6 in which a capacitor is connected across said pair of inputs in each detuning circuit.

8. The RF volume coil as recited in claim 1 in which said end loops and said longitudinal conductive elements are mounted on a tubular shaped substrate and each of said detuning circuits is mounted to said substrate and positioned adjacent to the capacitor to which it connects.

9. The RF volume coil as recited in claim 8 in which current limiting resistors are connected between the driver circuit and each of said detuning circuits.

* * * * *